United States Patent [19]

Martin et al.

[11] Patent Number: 6,071,398
[45] Date of Patent: Jun. 6, 2000

[54] PROGRAMMED PULSE ELECTROPLATING PROCESS

[75] Inventors: James L. Martin, Merrick; Stephane Menard, Freeport; David N. Michelen, Brooklyn, all of N.Y.

[73] Assignee: Learonal, Inc., Freeport, N.Y.

[21] Appl. No.: 08/944,753

[22] Filed: Oct. 6, 1997

[51] Int. Cl.[7] ........................................... C25D 5/18
[52] U.S. Cl. .......................... 205/103; 205/125; 205/296; 205/298; 205/920
[58] Field of Search ..................................... 205/103, 125, 205/296, 297, 298, 920

[56] References Cited

U.S. PATENT DOCUMENTS

| | | | |
|---|---|---|---|
| 4,666,567 | 5/1987 | Loch | 205/83 |
| 4,975,159 | 12/1990 | Dahms | 205/125 |
| 5,068,013 | 11/1991 | Bernards et al. | 205/125 |
| 5,486,280 | 1/1996 | Bullock, IV et al. | 205/67 |

OTHER PUBLICATIONS

George W. Jernstedt, Better Deposits At Greater Speeds By PR Plating, *Plating*, Jul., 1948.

*Primary Examiner*—Bruce F. Bell
*Assistant Examiner*—William T. Leader
*Attorney, Agent, or Firm*—Pennie & Edmonds LLP

[57] ABSTRACT

The present invention relates to a method of electrodepositing metal onto a substrate, which comprises applying a pulsed periodic reverse current across the electrodes of a plating cell utilizing a peak reverse current density and peak forward current density; and varying the ratio of peak reverse current density to peak forward current density in periodic cycles to provide metal deposits of uniform thickness and appearance upon the substrate. The invention also relates to a process for improving the properties of an electrodeposit, particularly on substrates having uneven surfaces or apertures, by using programmed pulse periodic reverse current modulation. More particularly, it involves varying the anodic to cathodic current density ratio, in order to improve the surface uniformity appearance, grain structure and levelling of the deposit while maintaining high current density throwing power.

22 Claims, 2 Drawing Sheets

PROGRAMMED PULSE ELECTROPLATING PROCESS

FIELD OF THE INVENTION

The present invention relates to a process for pulse periodic reverse ("PPR") electroplating. More particularly, this process involves varying the anodic to cathodic current density ratio in order to improve the surface appearance, grain structure and levelling of the deposit, while maintaining uniform metal distribution and appearance on the substrate when plating at high current densities.

BACKGROUND OF THE INVENTION

In conventional electroplating, an aqueous electrolytic solution can be prepared by dissolving a metal salt, such as copper sulfate, in sulfuric acid and water. If desired or necessary, additional agents, such as surfactants, brighteners, antioxidants and the like can be included in the solution to impart certain performance characteristics to the solution or deposit. The electrodes of an external circuit are then immersed into this electrolytic solution, and a DC current is applied across the electrodes. This causes an electrochemical reaction or reduction, resulting in the deposition of metal onto the cathode from the metal ions in the electrolytic solution. The current density profile and primary current distribution across the cathode varies according to the geometric path or distance between the anode and cathode, leading to deposit thickness variations according to the shape and location of the cathode relative to the anode. This effect is most apparent when high applied average current densities are used. Therefore, in order to obtain the best uniformity of metal distribution, low applied average current densities are used.

Alternatively, by using PPR current instead of DC current, uniform metal deposits can be produced at higher current densities. This technique is especially useful for electrolytic copper plating on high aspect printed circuit boards, which are relatively thick boards with small hole diameters. These substrates present particular problems because of their surface geometry, which affects current distribution, and results in measurable differences in current density between the surfaces of the board and the through-hole. This current density difference causes uneven metal deposition, with thicker coatings produced on surfaces with higher current densities. Generally, the edges of the board and isolated surface circuitry experience the higher current density and resultant thicker deposit compared to the center surfaces of the board or the inner surfaces of the hole. The additional thickness in these areas can present significant problems in subsequent processing and assembly operations. A non-uniform surface profile leads to increased soldermask being required to meet minimum thickness requirements for good coverage. The lack of circuit planarity and excess thickness at the hole entry can interfere with the proper location of components during assembly, while the methods used to reduce this excess thickness lead to excessive processing times and a loss of production.

With PPR current, also known as pulsed periodic reverse current, it is possible to produce uniform coatings with an even thickness on both the surface of the board and in the through-hole. A pulsed periodic reverse current is created by alternating the current modulation between forward and reverse cycles. Specifically, this is accomplished by inverting the current from cathodic to anodic mode, which disrupts the otherwise constant direct current polarization effects. The degree of disruption occurs according to the primary current distribution, with more in the high current density areas than in the low current density areas, thus providing a normalization of deposition rates across complex geometries at higher applied average current densities. Moreover, by maintaining thickness uniformity at higher applied average current densities, the overall deposition rate is increased and processing times reduced thereby yielding higher production output.

Although the use of pulse periodic reverse current results in uniform coating thicknesses at high current densities, the surface appearance of the resulting deposit will range from a matte to a semi-bright finish, relative to the hole wall thus producing a non-uniform deposit appearance between high (surface) and low (hole) current densities. On the other hand, if DC current is applied, uniformly bright deposits are produced, throughout the current density range, but low current densities must be used in order to preserve coating thickness uniformity. Thus, neither method provides optimum thickness distribution with uniform metal deposit appearance at high current densities.

Electroplating methods are used to deposit metal onto substrates for various purposes, such as providing a decorative or protective coating, improving solderability, reducing contact resistance, increasing surface conductivity or reflectivity, and improving hardness and wear resistance. With this wide range of useful purposes in mind, it would be very beneficial to develop an electroplating technique which produces a metal coating with a uniform finish, while maintaining high current density throwing power at high applied current densities.

SUMMARY OF THE INVENTION

The invention relates to a method of electrodepositing metal onto a substrate, by applying a pulsed periodic reverse current across the electrodes of a plating cell utilizing a peak reverse current density and peak forward current density, and varying the ratio of peak reverse current density to peak forward current density in periodic cycles to provide a metal deposit of uniform appearance, fine grain structure and uniform thickness onto the substrate. A preferred, convenient way to vary this ratio is by holding the peak forward current constant while varying the peak reverse current density.

Advantageously, the ratio of peak reverse current density to peak forward current density has at least a first value in a first time period, and a second, different value in a second time period, and the uniform thickness and appearance of the metal deposit is achieved by varying the ratio between the first and second values. Preferably, the ratio of peak reverse current density to peak forward current density has a first value in a first time period, a second value in a second time period, and a third value in a third time period, and the uniform thickness and appearance of the metal deposit is achieved by varying the ratio sequentially between the first, second and third values. A more preferred method is to vary the ratio sequentially between the first, second, third, second and first values.

The electrolytic solution that is used typically contains agents that are stable in the solution and produce desired improvement in the metal deposit. When bright copper deposits are desired, the electrolytic solution is an aqueous acid copper electrolyte, produced by combining sulfuric acid, copper sulfate, and chloride anions. One prominent use for such bright copper deposits is upon a printed circuit board substrate having a plurality of through holes therein. The present process allows one to provide a copper deposit of uniform appearance, fine grained structure and uniform thickness both on the surface of the circuit board and in the through holes.

Another embodiment of the invention relates to a method of enhancing the properties of an electrodeposit which comprises providing the electrodeposit upon a substrate by a pulse periodic reverse electroplating process while varying the anode/cathode current density ratio to provide a metal deposit of uniform appearance, fine grain structure and uniform thickness. When the substrate has uneven surfaces or apertures therein, this method enables one to provide a metal deposit of uniform appearance, fine grain structure and uniform thickness both on the surface of the substrate and in the through holes.

BRIEF DESCRIPTION OF THE DRAWINGS

Additional features of the invention are set forth in the following detailed description as well as in the attached drawings in which.

DETAILED DESCRIPTION OF THE PREFERRED EMBODIMENTS

Figure 1:
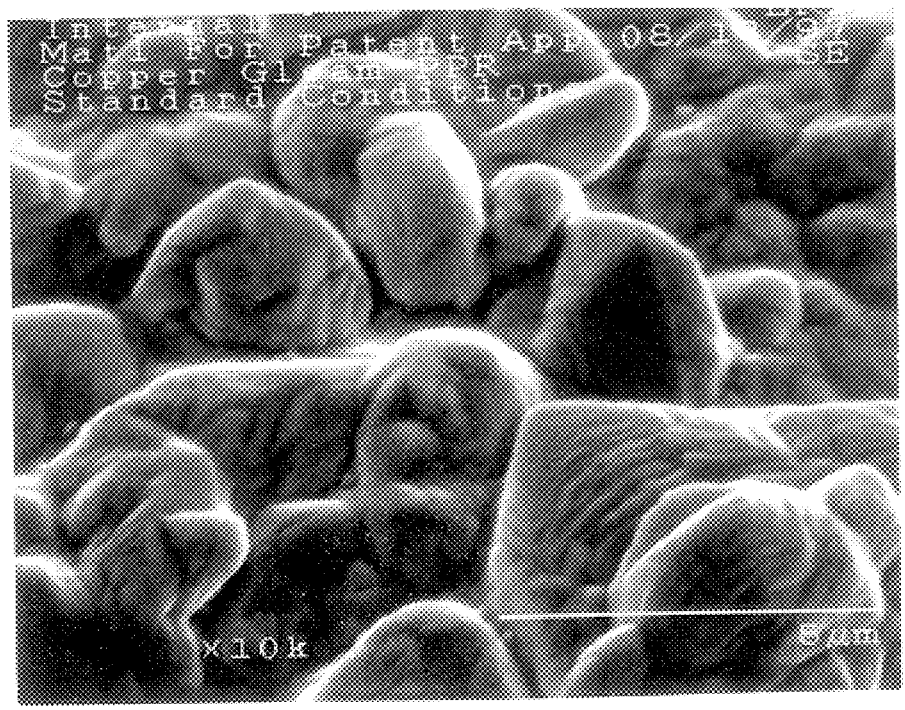
FIG. 1 is a photomicrograph which illustrates the grain structure of a copper deposit provided according to the prior art on the surface of a printed circuit board.

The present invention relates to an improved method for electrodepositing metal onto a substrate. This inventive process is particularly useful for electroplating substrates with apertures or uneven surfaces. By applying this process, it is possible to improve the surface appearance including brightness, grain structure and through-hole levelling of the electrodeposit, while maintaining throwing power at high current densities.

In the present invention, a substrate and a second metal are immersed in an electrolytic solution, thereby forming the electrodes of a plating cell. A pulse generating unit supplies a pulsed periodic reverse current which is applied across the electrodes. The pulse generating system has the capability of generating forward and reverse currents of different magnitudes.

In the present invention, pulse timing, average current density, and initial forward and reverse current densities may be preset manually. During the electroplating process, the ratio of peak reverse current density to peak forward current density is varied. More specifically, the ratio of peak reverse current density to peak forward current density has a first value for a first time period, a second value for a second time period, and a third value for a third time period. These ratios may be also be varied in periodic cycles.

The choice of metal to be electrodeposited onto a substrate depends on the application. For example, copper is generally used as an undercoat for protection and/or conductivity, while gold is often used as a topcoat for decoration, protection and/or function, e.g., electrical contacts. Any one of a wide variety of metals can be used in the present invention, including tin, lead, palladium, gold, nickel, silver, zinc, copper, and alloys of two or more of these or other metals. The present invention is particularly useful for electrodepositing copper onto printed circuit boards with high aspect ratios, where aspect ratio is board thickness divided by hole diameter.

The circuit board and a copper anode are immersed in a standard acid copper electrolyte which contains 100 to 150 mL/L sulfuric acid, 15 to 75 g/L copper sulfate pentahydrate, 60 ppm chloride ions, combined with 15 mL/L PPR carrier and 0.5 mL/L PPR additive. The carrier is typically a surface active agent, such as a polyoxyalkylene compound, and is included in the process for primary grain refinement. The additive is typically an organosulfur compound that provides additional grain refinement necessary for the metallurgical strength of the deposits.

A pulse generating unit supplies a pulsed periodic reverse current which is applied across the electrodes of the plating cell. A typical pulse generating system generates a forward current of up to 800 amps and a reverse current of up to 2500 amps although other systems can be used. A switch mode rectifier which generates pulsed output with high energy reverse pulse is what is generally required for this invention.

Each system comprises a pulse engine and a separate control unit which sets and controls the pulse output in terms of a forward pulse time ranging from about 1 to 50 and preferably about 10 to 30 milliseconds; a reverse pulse time ranging from about 0.1 to 4 and preferably about 0.5 to 2 milliseconds; a forward peak current ranging from about 50 to 800 and preferably 100 to 300 amps; and a reverse peak current ranging from about 50 to 2500 and preferably about 400 to 1200 amps. A current density in the range of between 5 and 200 and preferably 20 to 100 ASF is typically used. Power is supplied for as long as is necessary to produce the desired deposits.

A single power unit linked to its individual control unit can be used as a stand alone system, but for larger multiple installations, all control units can be linked using computer control, such as an RS485 data link. Pulse timing is then set and controlled from one controller which is configured as the master. Alternatively a personal or plant computer can be used to control all pulse units in the entire installation.

Pulse timing, average current density, and initial forward and reverse current densities may be either preset manually, or automatically set by the control unit. Average current density can be preset at a particular value, e.g, 33 amps per square feet, and power then supplied for the necessary time period, e.g., 45 minutes. A preferred pulse timing can be set, such as 20 milliseconds forward and 1 millisecond reverse.

During the electroplating process, the ratio of peak reverse current density to peak forward current density is varied. More specifically, peak reverse current is generally varied while holding peak forward current density constant. For the duration of a first time period, the ratio of peak reverse current density to peak forward current density is held at 1 to 1. For the duration of a second time period, the ratio of peak reverse current density to peak forward current density is held at 2 to 1. After the second time period, the sequence may be repeated over the entire plating time.

More complex variations are also contemplated by the invention. After the first and second time periods described above, a third time period can be applied, where the ratio of peak reverse current density to peak forward current density is held at 3 to 1. During a fourth time period the ratio is held at 2 to 1. After the fourth time period, the sequence may be repeated over the entire plating time.

It is also understood that the ratios in successive time periods can be any multiples. For example, ratio variances such as 1:1/5:1/2:1/7:1/(sequence repeat), 1:1/3:1/5:1/3:1/ (sequence repeat) or 7:2/3:2/15:2/(sequence repeat), or any other variance within the ability of one of ordinary skill in the art can be used in this invention. Routine tests can be used to determine which sequences provide optimum results for any particular plating application. Any sequence variation is believed to provide better performance than conventional PPR or DC plating, especially when the parts have a non-uniform surface, holes or other discontinuities or an irregular shape.

EXAMPLES

The following examples illustrate the most preferred embodiments of the pulse periodic reverse electroplating process. It is understood that these examples are for illustrative purposes and are not intended to limit the scope of the invention.

Example 1

This Example presents a comparison of Hull cell tests to demonstrate that the programmed pulse plating of the invention will produce an uniform deposit appearance across the current density range equivalent to that obtained by DC plating. Three Hull tests were performed independently. For each test, a Hull cell was immersed in a standard copper plating solution containing 120 mL/L sulfuric acid, 75 g/L copper sulfate pentahydrate, 60 ppm chloride ions, 15 mL/L PPR carrier and 0.5 mL/L PPR additive. All three Hull test panels were electroplated for 15 minutes.

The first Hull test panel was electroplated by applying a direct current of 1 amp across the electrodes of a plating cell for 15 minutes. The second Hull test panel was electroplated using a pulsed periodic reverse current of 1 amp average, with pulse times of 20 msec forward current and 1 msec reverse current. For the second Hull test panel, the anodic to cathodic current density ratio was held constant at 3 to 1 during the entire plating time.

The third Hull test panel was also electroplated using a pulsed periodic reverse current of 1 amp average/15 mins, with pulse times of 20 msec forward and 1 msec reverse. However, for the third Hull test panel, the anodic to cathodic current density ratio was varied in periodic cycles, consisting of three minute time periods. For the first time period, the anodic to cathodic current density ratio was 1 to 1. For the second time period, the anodic to cathodic current density ratio was changed to 2 to 1 by increasing the peak reverse current density. In the third period, the anodic to cathodic current density ratio was changed to 3 to 1. In the fourth time period, the anodic to cathodic current density ratio was changed back to 2 to 1. Finally, in the fifth time period the anodic to cathodic current density ratio was 1 to 1.

TABLE 1

| Process | Current Density Range | Deposit Appearance |
| --- | --- | --- |
| DC Current (prior art) | 0–40 ASF | Bright Uniform Deposit |
| PPR Current (constant CD ratio) (prior art) | 0–20 ASF 20–40 ASF | Semi-bright Deposit Matte Deposit Non-uniform Deposit |
| PPR Current (varied CD ratio) (the invention) | 0–40 ASF | Bright Uniform Deposit |

The results show that the DC current and PPR current with (varied CD ratio) provide bright uniform deposits over the entire current density range tested.

Example 2

Two printed circuit boards were electroplated independently. The printed circuit boards are 62 mils thick with 28 mils diameter holes. Each board was immersed in a one gallon tank containing the same standard copper solution of Example 1.

Each circuit board was electroplated for 45 minutes, using a pulsed periodic reverse current, with pulse times of 20 msec forward current and 1 msec reverse current. Both were plated at an average current density of 33 ASF.

The first board was electroplated while keeping the anodic to cathodic current density ratio at 2.8 for the entire plating time. Conversely, the second board was electroplated while varying the anodic to cathodic current density ratio, using the same technique employed with the third substrate in Example 1. The results are reported in Table 2.

TABLE 2

| Process | Surface to Hole Ratio | Deposit Appearance on the Surface | Deposit Appearance in the Hole |
| --- | --- | --- | --- |
| PPR Current constant CD ratio (Prior art) | 0.67 (S = 1.08, H = 1.61) | Matte Large Grained Deposit | Bright Fine Grain and Levelled Deposit |
| PPR Current varied CD ratio (the invention) | 0.76 (S = 1.16, H = 1.52) | Bright Fine Grained Deposit | Bright Fine Grain and Levelled Deposit |

Again, the results show that the uniformity of the deposit appearance and its high current density grain structure are enhanced according to the process of the present invention without any significant loss in coating thickness distribution.

Example 3

Six printed circuit boards were electroplated independently. Each of these boards were pre-treated and cleaned before being immersed in a plating bath. The plating bath was composed of 150 mL/L sulfuric acid, 75 g/L copper sulfate pentahydrate, 60 ppm chloride ions, 15 mL/L PPR carrier and 0.5 mL/L PPR additive. The PPR additive is replenished twice during plating with 0.2 mL/L. Each board was electroplated for 45 minutes, at an average current density of 33 ASF.

The first board (Sample A) was electroplated using a DC current at 20 ASF for 90 minutes. The other boards were electroplated for 45 minutes at an average current density of 33ASF with various pulse cycles. The second board (Sample B) was electroplated using a pulse periodic reverse current with a constant anodic to cathodic current density ratio (20 msec forward, 1 msec reverse—prior art).

Specifically, the third board (Sample 1) was electroplated while changing the anodic to cathodic current density ratio from 1:1 to 2:1, from 2:1 to 3:1, from 3:1 to 2:1, and from 2:1 to 1:1. The fourth board (Sample 2) was electroplated while changing the anodic to cathodic current density ratio from 1:1 to 3:1, and from 3:1 back to 1:1. The fifth board (Sample 3) was electroplated while changing the anodic to cathodic current density ratio from 3:1 to 2:1, and from 2:1 to 1:1. The sixth board (Sample 4) was electroplated while changing the anodic to cathodic current density ratio from 1:1 to 2:1, from 2:1 to 3:1, from 3:1 to 2:1, and from 2:1 to 1:1. This sequence was similar to that used for the third board, except that it was repeated periodically over the entire plating time. The results are reported in Table 3.

TABLE 3

| Sample | Average Thickness on Surface (Mils) | Average Thickness on Hole (Mils) | Surface to Hole Ratio | Diameter of Hole (Mils) | Appearance |
| --- | --- | --- | --- | --- | --- |
| A | 1.14 | 0.9 | 1.26 | 30.2 | Uniform Bright Deposit |
| B | 0.87 | 1.30 | 0.67 | 30.0 | Non-uniform Matte/ Semi-Bright Deposit |
| 1 | 0.84 | 1.20 | 0.70 | 30.3 | Uniform Deposit |
| 2 | 0.71 | 1.02 | 0.69 | 29.8 | Uniform Deposit |
| 3 | 1.01 | 1.12 | 0.90 | 29.7 | Uniform Deposit |
| 4 | 0.84 | 1.19 | 0.71 | 29.9 | Uniform Deposit |

Samples A and B are prior art
Samples 1–4 are according to the invention

The results from Table 3 show improved uniformity of the deposit appearance and equivalent high current density throwing power (Examples 1–4) when the methods of the invention are followed.

To further illustrate the advantages of the invention, the scanning electron microscope photomicrographs of FIGS. 1–4 are presented. These figures were taken at a magnification of 10,000× on Sample B (prior art—FIGS. 1 and 2) and Sample 1 (the invention—FIGS. 3 and 4).

Figure 2:
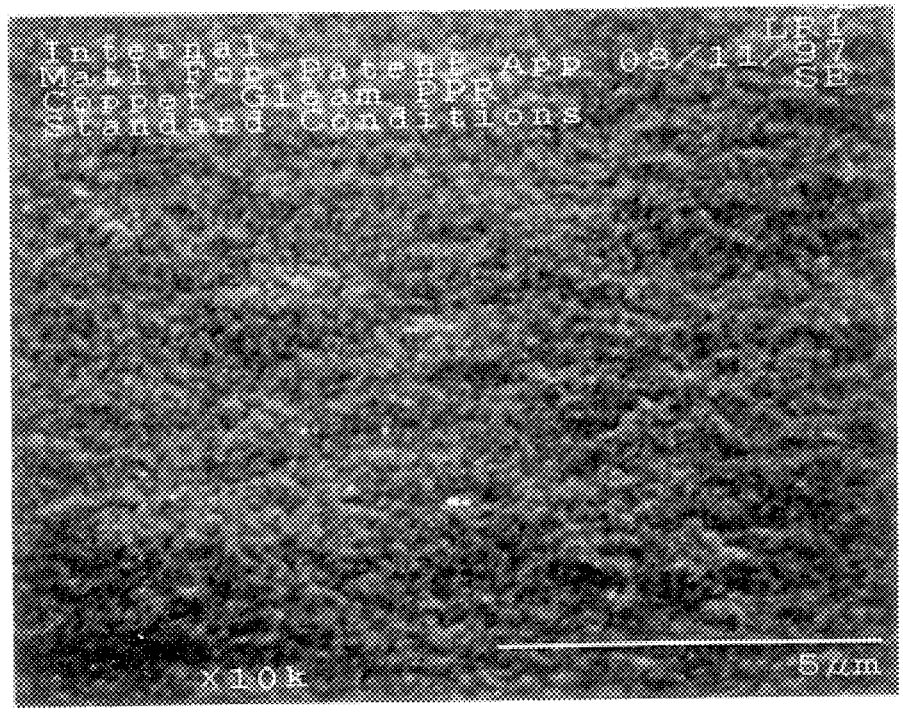
FIG. 2 is a photomicrograph which illustrates the grain structure of a copper deposit provided according to the prior art in a through-hole of a printed circuit board.
Figure 3:
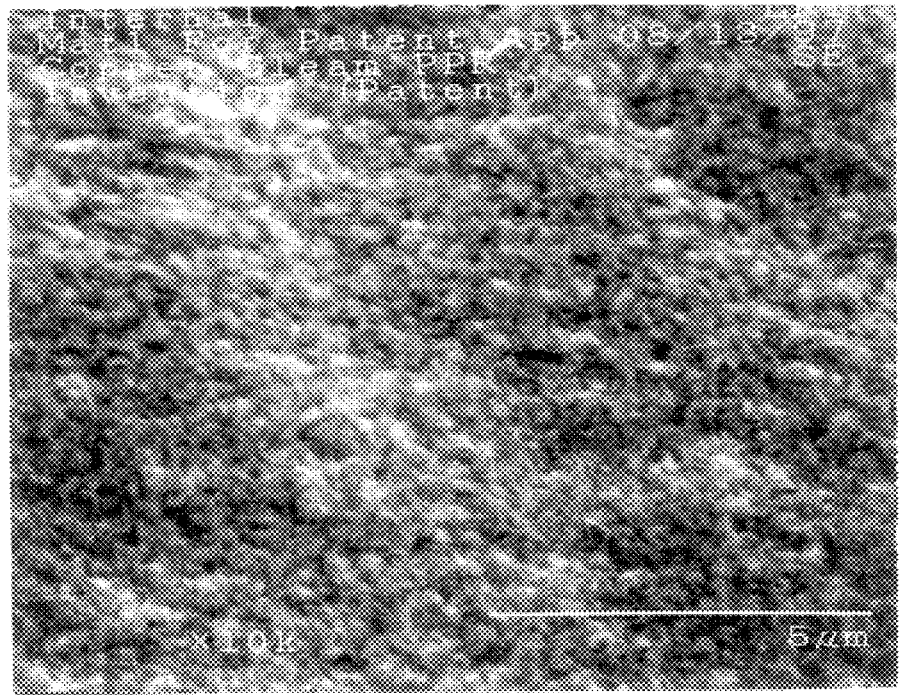
FIG. 3 is a photomicrograph which illustrates the grain structure of a copper deposit provided according to the present invention on the surface of a printed circuit board.
Figure 4:
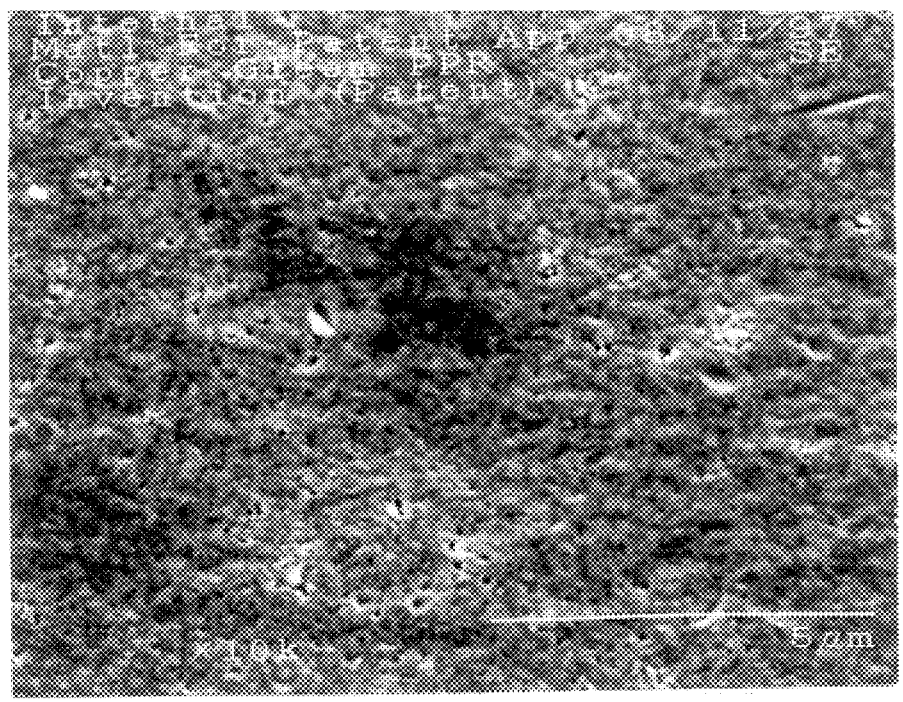
FIG. 4 is a photomicrograph which illustrates the grain structure of a copper deposit provided according to the present invention in a through-hole of a printed circuit board.

FIGS. 1 and 2 show the non-uniformity of grain structure and appearance between the deposit on the board surface and that in the through-hole. In comparison, FIGS. 3 and 4 show that the invention provides a uniform grain structure and appearance for both the deposit on the surface and in the through-hole.

The foregoing examples are intended to illustrate typical improvements in appearance uniformity, grain structure and levelling capability, without any loss in throwing power that can be obtained using the pulse periodic reverse electroplating process disclosed herein of course, similar improvements may be obtained by varying the anodic to cathodic current density ratio in other sequential patterns. Thus, it is understood that what has been described what is at present considered to be a preferred embodiment of this invention. It is further understood that various changes and modifications may be made without departing from the scope of the invention which is defined in the following claims.

What is claimed is:

1. A method of electroplating metal onto a substrate, which comprises applying a pulsed periodic reverse current comprising an uninterrupted, sequential forward to reverse, reverse to forward, continuously repeating pulsing sequence across the electrodes of a plating cell utilizing a peak reverse current density and a peak forward current density, and varying the ratio of the peak reverse current density to the peak forward current density in periodic cycles comprising first, second and third values of ratios of peak reverse current density to peak forward current density to provide a metal deposit of uniform appearance, fine grain structure and uniform thickness on the substrate, wherein the ratio of peak reverse current density to peak forward current density is varied sequentially during the cycle between a first value in a first time period, a second value which is different than the first value in a second time period, and a third value which is different than the second value in a third time period.

2. The method of claim 1, wherein the ratio is varied by holding the peak forward current constant while varying the peak reverse current density.

3. The method of claim 1, which further comprises providing an electrolytic solution which contains agents that are stable in the solution and produce desired improvement in the metal deposit.

4. The method of claim 3, wherein the electrolytic solution is an aqueous acid copper electrolyte, produced by combining sulfuric acid, copper sulfate, and chloride anions; and which further comprises providing a copper deposit of uniform appearance, fine grain structure and uniform thickness on the substrate.

5. The method of claim 4, wherein the substrate is a printed circuit board having a plurality of through holes therein, and which further comprises providing a bright copper deposit of uniform appearance, fine grain structure and uniform thickness both on the surface of the circuit board and in the through holes.

6. The method of claim 1, wherein the substrate has uneven surfaces and apertures therein, and which further comprises providing a bright metal deposit of fine grain structure and uniform thickness both on the uneven surfaces and in the apertures of the substrate.

7. The method of claim 1 wherein the metal to be electrodeposited is copper.

8. The method of claim 1 which further comprises a forward pulse time ranging from about 1 to 50 milliseconds, a reverse pulse time of about 0.1 to 4 milliseconds, a forward peak current of about 50 to 800 amps, and a reverse peak current of about 50 to 2500 amps.

9. A method of enhancing the properties of an electrodeposit which comprises providing the electrodeposit upon a substrate by a pulse periodic reverse electroplating process comprising an uninterrupted, sequential forward to reverse, reverse to forward, continuously repeating pulsing sequence while varying the anode/cathode current density ratio in periodic cycles comprising first, second and third values of ratios of peak reverse current density to peak forward current density to provide a metal deposit of uniform appearance, fine grain structure and uniform thickness on the substrate, wherein the ratio of peak reverse current density to peak forward current density is varied sequentially during the cycle between a first value in a first time period, a second value which is different than the first value in a second time period, and a third value which is different than the second value in a third time period.

10. The method of claim 9, wherein the ratio is varied by holding the peak forward current constant while varying the peak reverse current density.

11. The method of claim 9, which further comprises providing an electrolytic solution which contains agents that are stable in the solution and produce additional enhancements in the metal deposit.

12. The method of claim 11, wherein the electrolytic solution is an aqueous acid copper electrolyte, produced by combining sulfuric acid, copper sulfate, and chloride anions; and which further comprises providing a copper deposit of uniform appearance, fine grain structure and uniform thickness on the substrate.

13. The method of claim 12, wherein the substrate is a printed circuit board having a plurality of through holes therein, and which further comprises providing a copper deposit of uniform appearance, fine grain structure and uniform thickness both on the surface of the circuit board and in the through holes.

14. The method of claim 9, wherein the substrate has uneven surfaces and apertures therein, and which further comprises providing a metal deposit of uniform appearance, fine grain structure and uniform thickness both on the uneven surface of the substrate and in the apertures.

15. The method of claim 9, wherein the cycle further comprises a fourth value for the ratio of peak reverse current density to peak forward current density and which further comprises varying the ratio sequentially between the first, second, third and fourth values.

16. The method of claim 15, wherein the ratio for the first, second, third and fourth values during the cycle varies between 1:1/2:1/3:1/2:1, 1:1/5:1/2:1/7:1, or 1:1/3:1/5:1/3:1.

17. The method of claim 9 which further comprises a forward pulse time ranging from about 1 to 50 milliseconds, a reverse pulse time of about 0.1 to 4 milliseconds, a forward peak current of about 50 to 800 amps, and a reverse peak current of about 50 to 2500 amps.

18. A method for electroplating a substrate, which comprises electrolytically depositing metal on a substrate utilizing a plating current that includes an uninterrupted, sequential forward to reverse, reverse to forward, continuously repeating pulsing sequence with a peak reverse current density and a peak forward current density, and varying the ratio of the peak reverse current density to the peak forward current density in periodic cycles comprising first, second and third values of ratios of peak reverse current density to peak forward current density during the electrolytic deposition of the metal, wherein the ratio of peak reverse current density to peak forward current density is varied sequentially during the cycle between a first value in a first time period, a second value which is different than the first value in a second time period, and a third value which is different than the second value in a third time period.

19. The method of claim 18 wherein the substrate is a printed circuit board substrate.

20. The method of claim 19 wherein the metal to be electrolytically deposited on the printed circuit board substrate is copper.

21. A method of electrodepositing metal onto a substrate, which comprises applying a pulsed periodic reverse current across the electrodes of a plating cell utilizing a peak reverse current density and peak forward current density; and varying the ratio of peak reverse current density to peak forward current density in periodic cycles to provide a metal deposit of uniform appearance, fine grain structure and uniform thickness, with the ratio of peak reverse current density to peak forward current density having a first value in a first time period, a second value in a second time period, and a third value in a third time period, and the ratio is varied sequentially between the first, second, third, second and first values.

22. A method of enhancing the properties of an electrodeposit which comprises providing the electrodeposit upon a substrate by a pulse periodic reverse electroplating process while varying the anode/cathode current density ratio to provide a metal deposit of uniform appearance, fine grain structure and uniform thickness on the substrate, with the ratio of peak reverse current density to peak forward current density having a first value in a first time period, a second value in a second time period, and a third value in a third time period, and the ratio is varied sequentially between the first, second, third, second and first values.

* * * * *